United States Patent
Padhi et al.

(10) Patent No.: US 9,613,908 B2
(45) Date of Patent: Apr. 4, 2017

(54) ULTRA-THIN DIELECTRIC DIFFUSION BARRIER AND ETCH STOP LAYER FOR ADVANCED INTERCONNECT APPLICATIONS

(71) Applicant: Applied Materials, Inc., Santa Clara, CA (US)

(72) Inventors: Deenesh Padhi, Sunnyvale, CA (US); Yihong Chen, San Jose, CA (US); Kelvin Chan, San Ramon, CA (US); Abhijit Basu Mallick, Fremont, CA (US); Alexandros T. Demos, Fremont, CA (US); Mukund Srinivasan, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/943,913

(22) Filed: Nov. 17, 2015

(65) Prior Publication Data

US 2016/0172239 A1  Jun. 16, 2016

Related U.S. Application Data

(60) Provisional application No. 62/092,107, filed on Dec. 15, 2014.

(51) Int. Cl.
 *H01L 21/00* (2006.01)
 *H01L 23/532* (2006.01)
 (Continued)

(52) U.S. Cl.
 CPC .......... *H01L 23/5329* (2013.01); *C23C 16/30* (2013.01); *C23C 16/452* (2013.01);
 (Continued)

(58) Field of Classification Search
 CPC .......... H01L 21/0228; H01L 21/02274; H01L 21/02178; H01L 21/0234; H01L 21/3145
 See application file for complete search history.

(56) References Cited

U.S. PATENT DOCUMENTS 5,364,664 A * 11/1994 Tsubouchi .......... C23C 16/0227
 257/E21.171
5,534,069 A *  7/1996 Kuwabara .............. B01D 53/72
 118/715

(Continued)

OTHER PUBLICATIONS

International Search Report and Written Opinion for International Application No. PCT/US2015/061159 dated Feb. 25, 2016.

*Primary Examiner* — Ngan Ngo
(74) *Attorney, Agent, or Firm* — Patterson + Sheridan, LLP

(57) ABSTRACT

Implementations described herein generally relate to the formation of a silicon and aluminum containing layer. Methods described herein can include positioning a substrate in a process region of a process chamber; delivering a process gas to the process region, the process gas comprising an aluminum-containing gas and a silicon-containing gas; activating a reactant gas comprising a nitrogen-containing gas, a hydrogen containing gas, or combinations thereof; delivering the reactant gas to the process gas to create a deposition gas that deposits a silicon and aluminum containing layer on the substrate; and purging the process region. The above elements can be performed one or more times to deposit an etch stop stack.

20 Claims, 3 Drawing Sheets

(51) Int. Cl.
*H01L 21/02* (2006.01)
*C23C 16/30* (2006.01)
*C23C 16/452* (2006.01)
*C23C 16/455* (2006.01)
*H01L 21/768* (2006.01)

(52) U.S. Cl.
CPC .... *C23C 16/45523* (2013.01); *H01L 21/0228* (2013.01); *H01L 21/0234* (2013.01); *H01L 21/02178* (2013.01); *H01L 21/02274* (2013.01); *H01L 21/76834* (2013.01); *H01L 23/53295* (2013.01); *H01L 23/53238* (2013.01); *H01L 2924/0002* (2013.01)

(56) References Cited

U.S. PATENT DOCUMENTS

| | | | | |
|---|---|---|---|---|
| 5,594,280 | A | * | 1/1997 | Sekiguchi ............... C23C 16/20 257/765 |
| 5,714,306 | A | * | 2/1998 | Komatsu ............... C23C 16/047 216/41 |
| 5,863,706 | A | * | 1/1999 | Komatsu ............... C23C 16/047 216/51 |
| 2001/0029094 | A1 | | 10/2001 | Mee-Young et al. |
| 2001/0045660 | A1 | * | 11/2001 | Tsubouchi ........ H01L 21/76841 257/761 |
| 2002/0046986 | A1 | * | 4/2002 | Kawai ............... H01L 21/31116 216/58 |
| 2002/0160553 | A1 | * | 10/2002 | Yamanaka .......... H01L 27/1285 438/149 |
| 2003/0015764 | A1 | * | 1/2003 | Raaijmakers ..... H01L 21/02145 257/424 |
| 2005/0054213 | A1 | | 3/2005 | Derderian et al. |
| 2009/0315093 | A1 | | 12/2009 | Li et al. |
| 2010/0081094 | A1 | * | 4/2010 | Hasebe ................... C23C 16/02 430/323 |
| 2011/0117728 | A1 | * | 5/2011 | Su ....................... C23C 16/4404 438/478 |
| 2011/0281379 | A1 | * | 11/2011 | Yang ................. H01L 21/02071 438/16 |
| 2012/0156895 | A1 | | 6/2012 | Shealy et al. |
| 2012/0219711 | A1 | * | 8/2012 | Merkel ................. C23C 16/402 427/255.28 |
| 2013/0112986 | A1 | | 5/2013 | Hsiung et al. |
| 2013/0186464 | A1 | * | 7/2013 | Sheng .................. H01L 31/068 136/256 |
| 2013/0247972 | A1 | * | 9/2013 | Mungekar .......... H01L 31/02167 136/256 |
| 2014/0208968 | A1 | * | 7/2014 | Shibusawa ............. B41N 1/247 101/395 |

* cited by examiner

ULTRA-THIN DIELECTRIC DIFFUSION BARRIER AND ETCH STOP LAYER FOR ADVANCED INTERCONNECT APPLICATIONS

CROSS-REFERENCE TO RELATED APPLICATIONS

This application claims benefit of U.S. Provisional Patent Application Ser. No. 62/092,107, filed Dec. 15, 2014, which is herein incorporated by reference.

BACKGROUND

Field

Implementations described herein generally relate to semiconductor manufacturing. More specifically, implementations disclosed herein relate to silicon and aluminum containing layers.

Description of the Related Art

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.35 µm and even 0.25 µm feature sizes, and tomorrow's plants soon will be producing devices having even smaller geometries.

With continued device scaling, interconnect RC delay continues escalating. Among several efforts being made to address this challenge, one is to lower the capacitance contributed by the dielectric diffusion barrier layer. This can be achieved by either lowering the dielectric constant or physically thinning down the barrier. There are trade-offs with each approach.

Low dielectric constant (low k) barriers are generally less dense materials which limit their ability to function as robust barrier to oxidation, moisture penetration, and Cu diffusion. On the other hand, physically thinning down the barrier is constrained by the ability of the thin layer to serve as an effective etch stop layer, especially given micro-loading and non-uniformity of dry etch processes. In this context, traditional SiCN or SiOC based barrier/etch stop layers have reached their scaling limit.

Bilayer of SiCN or SiOC with alternative materials with much higher dry/etch etch selectivity than SiCN/SiOC have been considered in order to continue scaling effective capacitance while affording adequate etch stop protection. From this perspective, aluminum nitride (AlN) is an attractive alternative material. AlN has excellent selectivity to ultra low k (ULK) etch, good insulating properties and reasonable dielectric constant of 8-9. However, while AlN is a good etch stop layer, it is not hermetic. Conversely, SiCN or SiN are hermetic but limited in their etch stop capability.

Therefore, a there is a need for new layers for BEOL processes.

SUMMARY

Embodiments described herein generally provide method of forming an etch stop layer or an etch stop stack. By incorporating both silicon and aluminum into the same layer, an etch stop layer or stack can be formed with improved density, improved hermeticity and lower stress than standard barrier layers. The desired thickness can be achieved by depositing multiple layers.

In one implementation, a method of depositing a layer can include positioning a substrate in a process region of a process chamber; delivering a process gas to the process region, the process gas comprising an aluminum-containing gas and a silicon-containing gas; activating a reactant gas, the reactant gas comprising a nitrogen-containing gas, a hydrogen containing gas or combinations thereof; delivering the reactant gas to the process gas to create a deposition gas, the deposition gas depositing an silicon and aluminum containing layer on the substrate; and purging the process region.

In another implementation, a method of depositing a layer can include positioning a substrate in a process region of a process chamber; depositing a silicon-containing layer on the substrate, the deposition comprising: delivering a second process gas to the process region, the second process gas comprising a silicon-containing gas; activating a second reactant gas to produce an activated second reactant gas, the reactant gas comprising a nitrogen-containing gas, a hydrogen containing gas or combinations thereof; delivering the activated second reactant gas to the second process gas to create a second deposition gas; and purging the process region; depositing an aluminum-containing layer on the substrate, the deposition comprising: delivering a first process gas to the process region, the first process gas comprising an aluminum containing gas; activating a first reactant gas to produce an activated first reactant gas, the reactant gas comprising a nitrogen-containing gas, a hydrogen containing gas or combinations thereof; delivering an activated reactant gas to the process gas to create a deposition gas; and purging the process region; and providing a post deposition treatment which combines the aluminum-containing layer with the silicon-containing layer.

In another implementation, a device can include a substrate having an exposed surface, the exposed surface having one or more features formed therein; and an etch stop layer comprising an aluminum, silicon and nitrogen compound formed on the exposed surface.

BRIEF DESCRIPTION OF THE DRAWINGS

So that the manner in which the above recited features of the present disclosure can be understood in detail, a more particular description of the methods and devices, briefly summarized above, may be had by reference to implementations, some of which are illustrated in the appended drawings. It is to be noted, however, that the appended drawings illustrate only typical implementations and are therefore not to be considered limiting of its scope, for the devices and methods may admit to other equally effective implementations.

To facilitate understanding, common words have been used, where possible, to designate identical elements that are common to the figures. It is contemplated that elements disclosed in one implementation may be beneficially utilized on other implementations without specific recitation.

DETAILED DESCRIPTION

Implementations described herein generally provide method of forming a etch stop layers or stacks including silicon and aluminum composite materials. Silicon and aluminum composite materials, including SiAlCN, SiAlN, or SiAlON, can act both as a good diffusion barrier and an etch stop layer. Further, silicon and aluminum composite materials can perform the above functions at a thickness of less than 50 Å.

Several approaches may be used for deposition of the above described materials including PECVD, ALD/PEALD, UV assisted CVD, remote plasma assisted CVD and other implementations. Fundamentally, Si-containing (i.e. TMS, TSA etc.) and Al-containing (i.e., TMA) precursors are reacted with radicals generated from either direct/remote $NH_3$, $N_2+H_2$ plasma sources, or UV $NH_3$ sources, leading to SiAlN or SiAlCN deposits. Stoichiometry, film composition, and film quality can be controlled by modulation of precursor flow ratios, process temperature, pressure, radical density etc. Alternatively, monolayers of SiCN/SiN and AlN can be deposited in an alternating fashion followed by a suitable thermal/UV/plasma treatment to drive intermixing of the two materials to create the desired alloy ceramics.

Figure 1:
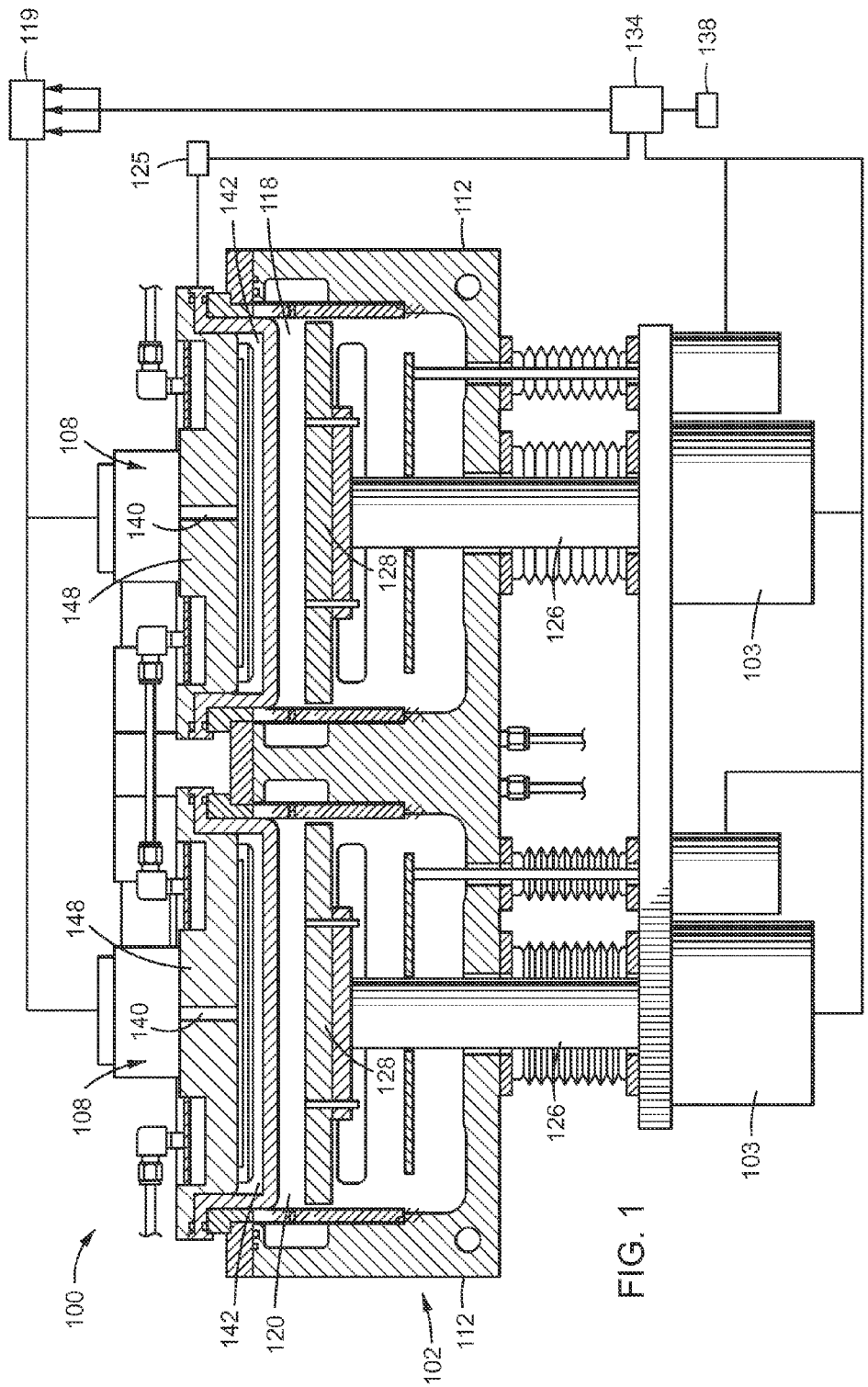
FIG. 1 is a cross sectional schematic diagram of a chemical vapor deposition (CVD) chamber that may be used to perform the methods described herein.

FIG. 1 is a cross sectional schematic diagram of a CVD chamber 100 that may be used for practicing implementations described herein. An example of such a chamber is a single or dual chamber on a PRODUCER® system, available from Applied Materials, Inc. of Santa Clara, Calif. The dual chamber has two isolated processing regions (for processing two substrates, one substrate per processing region) such that the flow rates experienced in each region are approximately one half of the flow rates into the whole chamber. The flow rates described in the examples below and throughout the specification are the flow rates per 300 mm substrate.

The CVD chamber 100 has a chamber body 102 that defines separate processing regions 118, 120. Each processing region 118, 120 has a pedestal 128 for supporting a substrate (not shown) within the CVD chamber 100. Each pedestal 128 typically includes a heating element (not shown). In one implementation, each pedestal 128 is movably disposed in one of the processing regions 118, 120 by a stem 126 which extends through the bottom of the chamber body 102 where it is connected to a drive system 103.

Each of the processing regions 118, 120 may include a gas distribution assembly 108 disposed through a chamber lid to deliver gases into the processing regions 118, 120. The gas distribution assembly 108 of each processing region normally includes a gas inlet passage 140 which delivers gas from a gas flow controller 119 into a gas distribution manifold 142, which is also known as a showerhead assembly. Gas flow controller 119 is typically used to control and regulate the flow rates of different process gases into the chamber. Other flow control components may include a liquid flow injection valve and liquid flow controller (not shown) if liquid precursors are used. The gas distribution manifold 142 comprises an annular base plate 148. The gas distribution manifold 142 includes a plurality of nozzles (not shown) through which gaseous mixtures are injected during processing. A radio frequency (RF) power supply 125 provides a bias potential to the gas distribution manifold 142 to facilitate generation of a plasma region between the gas distribution manifold 142 and the pedestal 128. During a plasma-enhanced chemical vapor deposition (PECVD) process, the pedestal 128 may serve as a cathode for generating the RF bias within the chamber body 102. The cathode is electrically coupled to an electrode power supply to generate a capacitive electric field in the chamber 100. Typically an RF voltage is applied to the cathode while the chamber body 102 is electrically grounded. Power applied to the pedestal 128 creates a substrate bias in the form of a negative voltage on the upper surface of the substrate. This negative voltage is used to attract ions from the plasma formed in the chamber 100 to the upper surface of the substrate.

During processing, process gases are uniformly distributed radially across the substrate surface. The plasma is formed from one or more process gases or a gas mixture by applying RF energy from the RF power supply 125 to the gas distribution manifold 142, which acts as a powered electrode. Film deposition takes place when the substrate is exposed to the plasma and the reactive gases provided therein. The chamber walls 112 are typically grounded. The RF power supply 125 can supply either a single or mixed-frequency RF signal to the gas distribution manifold 142 to enhance the decomposition of any gases introduced into the processing regions 118, 120.

A system controller 134 controls the functions of various components such as the RF power supply 125, the drive system 103, the lift mechanism, the gas flow controller 119, and other associated chamber and/or processing functions. The system controller 134 executes system control software stored in a memory 138, which in the preferred implementation is a hard disk drive, and can include analog and digital input/output boards, interface boards, and stepper motor controller boards. Optical and/or magnetic sensors are generally used to move and determine the position of movable mechanical assemblies.

The above CVD system description is mainly for illustrative purposes and other process chambers may also be employed for practicing implementations described herein. Process chambers that may be employed with implementations described herein include PECVD, ALD/PEALD, UV assisted CVD, remote plasma assisted CVD and other chambers for the deposition of layers from constituent gases. Further, though the chamber described above described the formation of plasma using an RF source, this is not meant to exclude other sources of plasma, including microwave plasma.

Figure 2:
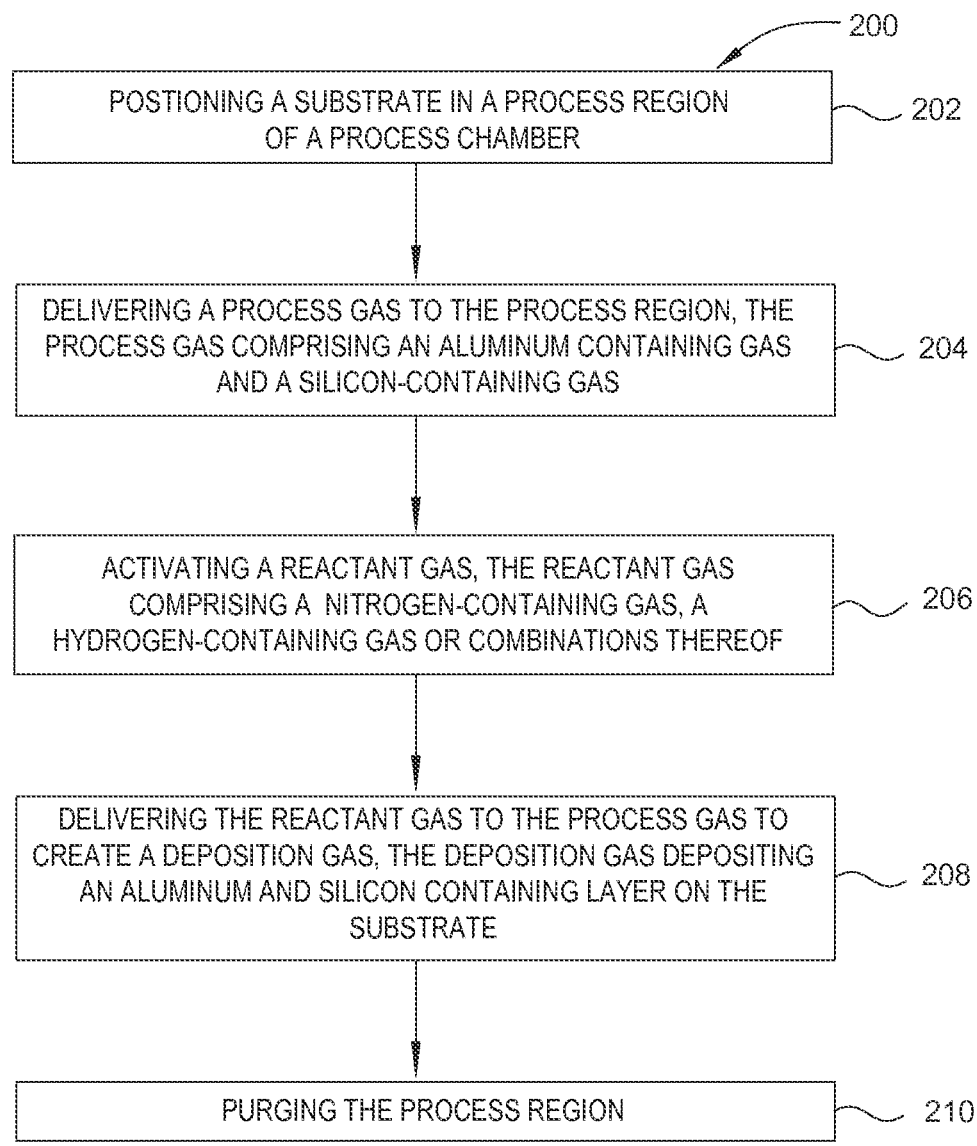
FIG. 2 depicts a flow diagram illustrating a method according to an implementation described herein.
Figure 3:
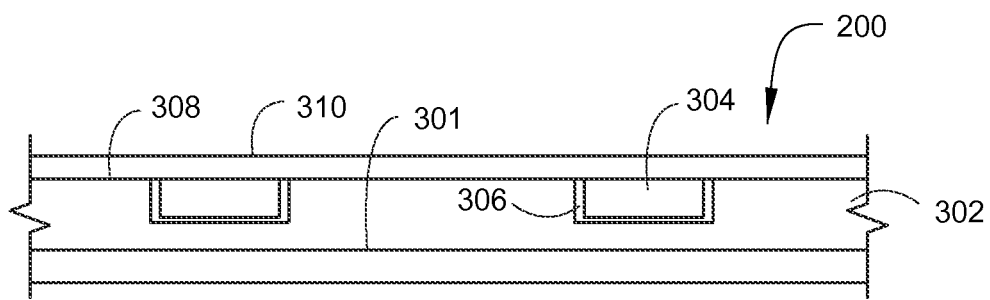
FIG. 3 depicts a schematic cross-sectional view of a substrate with a silicon and aluminum containing layer according to an implementation described herein.

FIG. 2 is a flow diagram of a method 200 according to an implementation. FIG. 3 illustrates a schematic cross sectional view of a substrate after deposition of the silicon and aluminum containing layer as described by method 200 of FIG. 2. The method 200 starts at 202 by positioning a substrate 300 in a process chamber, the substrate 300 shown in FIG. 3. The substrate 300 may be, among others, a thin sheet of metal, plastic, organic material, silicon, glass, quartz, or polymer materials. In one implementation, the substrate 300 is a silicon substrate upon which a silicon-containing dielectric is deposited. The substrate 300 may be circular, square or other shapes as known in the art.

The substrate 300 can have a dielectric layer 302 disposed over the substrate surface 301. Conductive contacts 304 are disposed within the dielectric layer 302 and are separated from the dielectric layer 302 by barrier layers 306. The dielectric layer 302 contains a dielectric material, such as a low-k dielectric material. In one example, the dielectric layer 302 contains a low-k dielectric material, such as a silicon carbide oxide material or a carbon doped silicon oxide material, for example, BLACK DIAMOND® II low-k dielectric material, available from Applied Materials, Inc., located in Santa Clara, Calif.

The feature barrier layer 306 may be conformally deposited into the feature within the dielectric layer 302. The feature barrier layer 306 may be formed or deposited by a physical vapor deposition (PVD) process, an atomic layer deposition (ALD) process, or a CVD process, and may have a thickness within a range from about 5 Å to about 50 Å, such as from about 10 Å to about 30 Å. The feature barrier layer 306 may contain titanium, titanium nitride, tantalum, tantalum nitride, tungsten, tungsten nitride, silicides thereof, derivatives thereof, or combinations thereof. In some implementations, the feature barrier layer 306 may contain a tantalum/tantalum nitride bilayer or titanium/titanium nitride bilayer. In one example, the feature barrier layer 306 can contain tantalum nitride and metallic tantalum layers deposited by PVD processes. The conductive contacts 304 may be a metal, such as copper.

With the substrate positioned in the process chamber, a process gas is delivered to the process region, at 204. The process gas comprises an aluminum containing gas and a silicon-containing gas. The silicon containing gas may include, but is not necessarily limited to silane, monochlorosilane, dichlorosilane, trichlorosilane, silicon tetrachloride, disilane, and trisilane. The silicon containing gas may be a carbon and silicon containing gas, including one or more organosilicon compounds described herein, for example, methylsilane ($CH_3SiH_3$), trimethylsilane (TMS), bis(diethylamino)silane (BDEAS), hexamethylcyclotrisilazane (HMCTZ), tris(dimethylamino)silane, tetrakis-(dimethylamino)silane, tetrakis(ethylmethylamino)silane tetraethylorthosilicate, derivatives thereof, or combinations thereof.

The process gas further includes an aluminum-containing gas. The aluminum-containing gas may include, but is not necessarily limited to trimethylaluminum, triethylaluminum, trimethylamine alane, aluminum chloride, dimethylaluminum hydride, diethylaluminum ethoxide derivatives thereof or combinations thereof. Additionally, an inert gas, such as a noble gas including helium and argon, may be used during the deposition process, and may be used as a carrier gas for the deposition process.

A reactant gas can then be activated, at 206. The reactant gas may be a nitrogen-containing gas or a hydrogen containing gas. The reactant gas may include, but is not necessarily limited to diatomic nitrogen, ammonia, diatomic hydrogen, hydrazine, tert-butylamine, 1,1-dimethylhydrazine and tert-butylhydrazine.

The reactant gas may be activated in a plasma region to create the activated reactant gas. This may include forming a plasma either in the plasma region of the process chamber or forming the plasma remotely. Further, the reactant gas may be formed into a plasma or may be activated by a second gas, which is formed into a plasma prior to being delivered to the process gas. The second gas may be an inert gas. The process chamber may produce an in-situ plasma or be equipped with a remote plasma source (RPS).

The reactant gas can then be delivered to the process gas to create a deposition gas, at 208. The activated reactant gas will react with the process gas to form a silicon and aluminum containing layer (e.g., etch stop layer 310) over the first surface 308 of the dielectric layer 302, shown in FIG. 3. The etch stop layer 310 can be between about 10 Å and about 100 Å thick, such as between about 20 Å and about 50 Å thick. In one example, the etch stop layer 310 is 20 Å thick. The etch stop layer 310 can include silicon, aluminum and nitrogen.

Parameters for deposition of the silicon and aluminum containing layer can include maintaining the process region at a pressure from about 0.01 torr to about 760 torr, such as from about 0.1 to about 10 torr. The temperature of the process region and the substrate can be maintained from about 200 degrees Celsius to about 1100 degrees Celsius, such as from about 400 to about 1000 degrees Celsius. The silicon-containing precursor can be delivered at a flow rate from about 2 standard cubic centimeters per minute (sccm) to about 1000 sccm in a carrier gas at a flow rate from about 100 sccm to about 20000 sccm. In one example, the silicon-containing precursor is delivered at a flow rate from about 10 sccm to about 500 sccm in a carrier gas flow from about 500 sccm to about 10000 sccm. The nitrogen-containing precursor can be delivered at a flow rate from about 2 sccm to about 5000 sccm in a carrier gas flow from about 100 sccm to about 20000 sccm. In one example, the nitrogen-containing precursor can be delivered at a flow rate from about 10 sccm to about 2500 sccm in a carrier gas flow from about 250 sccm to about 10000 sccm. The aluminum-containing precursor can be delivered at a flow rate from about 1 sccm to about 500 sccm in a carrier gas flow from about 10 sccm to about 5000 sccm. In one example, the aluminum-containing precursor can be delivered at a flow rate from about 5 sccm to about 100 sccm in a carrier gas flow from about 50 sccm to about 1000 sccm.

The silicon and aluminum containing layer can have a deposition rate from about 1 angstrom per minute to about 1000 angstroms per minute, such as a deposition rate from about 5 angstroms per minute to about 500 angstroms per minute.

Within the general implementations described herein, any one or more of the silicon-containing precursor, the nitrogen-containing precursor and the aluminum-containing precursor may be introduced into the reactor chamber at a uniform flow rate, or in the alternative any one or more of the foregoing precursors may be introduced into the reactor chamber at a non-uniform flow rate. Similarly, using implementations described herein, any two or all of the silicon precursor, the nitrogen precursor and the aluminum precursor may be introduced into the process region simultaneously (i.e., silicon-containing precursor and nitrogen-containing precursor; silicon-containing precursor and aluminum-containing precursor; nitrogen-containing precursor and aluminum-containing precursor; or silicon-containing precursor, nitrogen-containing precursor and aluminum-containing precursor).

The activated reactant gas and the process gas can then be purged from the process chamber, at 210. The purge can include delivering an inert gas to the process chamber. The inert gas can be a gas which is non-reactive or minimally reactive with relation to the deposited layer and the activated process gas, such as argon, helium, diatomic nitrogen or others. The inert gas can be delivered at a flow rate of between 100 sccm and 10000 sccm, such as a flow rate of 5000 sccm. The purge can be maintained until the chamber is free of process gas, reactant gas, activated reactant gas, and byproducts of the deposition of the etch stop layer 310.

The above method 200 can be repeated a plurality of times to create the desired thickness and hermeticity while maintaining conformal deposition of the layers.

While the foregoing is directed to implementations of the present disclosure, other and further implementations may be devised without departing from the basic scope thereof, and the scope thereof is determined by the claims that follow.

The invention claimed is:

1. A method of depositing a layer, comprising:
   positioning a substrate in a process region of a process chamber, wherein the substrate has a dielectric layer disposed over a surface of the substrate, and conductive contacts are disposed within the dielectric layer;
   delivering a process gas to the process region, the process gas comprising an aluminum-containing gas and a silicon-containing gas;

activating a reactant gas, the reactant gas comprising a nitrogen-containing gas;

delivering the reactant gas to the process gas to create a deposition gas, the deposition gas depositing a silicon and aluminum containing layer on the dielectric layer; and purging the process region.

2. The method of claim 1, wherein the aluminum-containing gas is trimethylaluminum (TMA).

3. The method of claim 1, wherein the silicon-containing gas is trimethylsilane (TMS).

4. The method of claim 1, wherein the silicon and aluminum containing layer comprises SiAlN, SiAlCN, or SiAlON.

5. The method of claim 1, wherein activating the reactant gas comprises converting the reactant gas to a plasma prior to delivering the reactant gas to the process gas.

6. The method of claim 1, wherein the reactant gas is activated in the presence of the process gas.

7. The method of claim 1, wherein the reactant gas comprises $NH_3$, $N_2$, $H_2$ or combinations thereof.

8. A method of depositing a layer, comprising:

positioning a substrate in a process region of a process chamber;

depositing a silicon-containing layer on the substrate, comprising:

delivering a first process gas to the process region, the first process gas comprising a silicon-containing gas;

activating a first reactant gas to produce an activated first reactant gas, the first reactant gas comprising a nitrogen-containing gas, a hydrogen containing gas, or combinations thereof;

delivering the activated first reactant gas to the first process gas to create a first deposition gas; and purging the process region;

depositing an aluminum-containing layer on the silicon-containing layer, comprising:

delivering a second process gas to the process region, the second process gas comprising an aluminum containing gas;

activating a second reactant gas to produce an activated second reactant gas, the second reactant gas comprising a nitrogen-containing gas, a hydrogen containing gas or combinations thereof;

delivering an activated second reactant gas to the second process gas to create a second deposition gas; and purging the process region; and providing a post deposition treatment which combines the aluminum-containing layer with the silicon-containing layer.

9. The method of claim 8, further comprising repeating the depositing the aluminum-containing layer and the depositing the silicon-containing layer.

10. The method of claim 8, wherein the post deposition treatment comprises an inert plasma treatment delivered to the aluminum-containing layer and the silicon-containing layer.

11. The method of claim 8, wherein the aluminum-containing gas is trimethylaluminum (TMA).

12. The method of claim 8, wherein the silicon-containing gas is trimethylsilane (TMS).

13. The method of claim 8, wherein the aluminum layer comprises AlN and the silicon-containing layer comprises SiN, SiCN, or SiON.

14. The method of claim 8, wherein the activating the first reactant gas or the second reactant gas comprises converting the first reactant gas or the second reactant gas to a plasma prior to delivering the first reactant gas or the second reactant gas to the process gas.

15. The method of claim 8, wherein the first reactant gas or the second reactant gas is activated in the presence of the first process gas or the second process gas, respectively.

16. The method of claim 8, wherein the first reactant gas or the second reactant gas comprises $NH_3$, $N_2$, $H_2$ or combinations thereof.

17. The method of claim 8, wherein the substrate has a dielectric layer disposed over a surface of the substrate, conductive contacts are disposed within the dielectric layer, and the silicon-containing layer is deposited on the dielectric layer.

18. The method of claim 8, wherein the post deposition treatment which combines the aluminum-containing layer with the silicon-containing layer forms a silicon and aluminum containing layer comprising SiAlN, SiAlCN, or SiAlON.

19. The method of claim 18, wherein the silicon and aluminum containing layer has a thickness between about 20 Å and about 50 Å.

20. The method of claim 8, wherein the first reactant gas and the second reactant gas are each independently selected from the group consisting of diatomic nitrogen, ammonia, diatomic hydrogen, hydrazine, tert-butylamine, 1,1-dimethylhydrazine and tert-butylhydrazine.

* * * * *